(12) United States Patent
Inoue

(10) Patent No.: US 7,419,387 B2
(45) Date of Patent: Sep. 2, 2008

(54) ELECTRIC CONNECTION MEMBER UTILIZING ANSIOTROPICALLY CONDUCTIVE SHEETS

(75) Inventor: Shuichi Inoue, Nishikamo-gun (JP)

(73) Assignee: J.S.T. Mfg. Co., Ltd., Osaka (JP)

( * ) Notice: Subject to any disclaimer, the term of this patent is extended or adjusted under 35 U.S.C. 154(b) by 132 days.

(21) Appl. No.: 10/571,009

(22) PCT Filed: Sep. 28, 2004

(86) PCT No.: PCT/JP2004/014166

§ 371 (c)(1), (2), (4) Date: Mar. 8, 2006

(87) PCT Pub. No.: WO2005/034293

PCT Pub. Date: Apr. 14, 2005

(65) Prior Publication Data

US 2007/0026710 A1 Feb. 1, 2007

(30) Foreign Application Priority Data

Sep. 30, 2003 (JP) ............................. 2003-340189

(51) Int. Cl.
*H01R 4/58* (2006.01)
(52) U.S. Cl. .......................................... 439/91; 439/591
(58) Field of Classification Search .................. 439/91, 439/591, 69, 68, 71, 72, 70, 525, 526
See application file for complete search history.

(56) References Cited

U.S. PATENT DOCUMENTS

| | | | | |
|---|---|---|---|---|
| 4,169,642 A | * | 10/1979 | Mouissie | 439/66 |
| 4,288,841 A | * | 9/1981 | Gogal | 361/792 |
| 4,371,912 A | * | 2/1983 | Guzik | 361/684 |
| 5,046,953 A | * | 9/1991 | Shreeve et al. | 439/66 |
| 5,089,881 A | * | 2/1992 | Panicker | 257/691 |

(Continued)

FOREIGN PATENT DOCUMENTS

JP 61-292809 A 12/1986

(Continued)

OTHER PUBLICATIONS

International Search Report.

*Primary Examiner*—Hae Moon Hyeon
(74) *Attorney, Agent, or Firm*—Rader, Fishman & Grauer, PLLC

(57) ABSTRACT

A second anisotropic electroconductive sheet 1 has a structure in which third elastomer regions 1B, each of which is electroconductive so as to enable current to flow between the front and the back thereof, are formed on an insulating second elastomer sheet 1A. An anisotropic electroconductive sheet 2 has a structure in which first elastomer regions 2B and second elastomer regions 3B, each of which is electroconductive so as to enable current to flow between the front and the back thereof, are formed on an insulating elastomer sheet 2A. The first elastomer regions 2B are arranged so as to match up with the third elastomer regions 1B. Furthermore, wiring patterns 2C are formed on the elastomer sheet 2A for connecting the first elastomer regions 2B and the second elastomer regions 3B. The second anisotropic electroconductive sheet 1 and the anisotropic electroconductive sheet 2 are layered one upon the other such that the third elastomer regions 1B and the first elastomer regions 2B are in contact with each other.

7 Claims, 5 Drawing Sheets

U.S. PATENT DOCUMENTS

| | | | |
|---|---|---|---|
| 5,123,850 A * | 6/1992 | Elder et al. | 439/67 |
| 5,131,852 A * | 7/1992 | Grabbe et al. | 439/71 |
| 5,479,319 A * | 12/1995 | Werther | 361/784 |
| 5,594,356 A * | 1/1997 | Turner et al. | 324/755 |
| 6,174,173 B1 * | 1/2001 | Fukunaga | 439/71 |
| 7,083,436 B2 * | 8/2006 | Brodsky | 439/91 |

FOREIGN PATENT DOCUMENTS

| | | |
|---|---|---|
| JP | 06-249924 A | 9/1994 |
| JP | 07-078524 A | 3/1995 |
| JP | 07-115280 A | 5/1995 |
| JP | 09-259959 A | 10/1997 |
| JP | 10-106700 A1 | 4/1998 |
| JP | 2000-86987 A | 3/2000 |
| JP | 2000-340037 A | 12/2000 |
| JP | 2001-194417 A | 7/2001 |
| JP | 2001-338836 A | 12/2001 |
| JP | 2003-243797 A | 8/2003 |
| JP | 2003-272789 A | 9/2003 |

* cited by examiner

ELECTRIC CONNECTION MEMBER UTILIZING ANSIOTROPICALLY CONDUCTIVE SHEETS

TECHNICAL FIELD

The present invention relates to an elastomer connector including an anisotropic electroconductive sheet, used as an electric connection member for connection between a printed board and an electronic device, connection between printed boards, and so forth, and particularly to an elastomer connector including a multilayer anisotropic-electroconductive sheet formed of two or more anisotropic electroconductive sheets.

BACKGROUND ART

Recently, the trend to develop a small structure or a thin structure of an electronic device has increased the need for connection between the fine circuit patterns, connection between the fine parts and fine circuit patterns, and so forth. Examples of the conventionally-employed connection methods include a soldering connection technique, a technique employing anisotropic electroconductive adhesive. Furthermore, a method is known in which an anisotropic electroconductive sheet is provided between an electronic device and a circuit board, thereby enabling electronic connection therebetween.

An anisotropic electroconductive sheet is an elastomer sheet which exhibits electroconductivity in a particular direction alone. Examples of anisotropic electroconductive sheets include: an anisotropic electroconductive sheet which exhibits electroconductivity only in the direction perpendicular to the plane of the sheet (i.e., the thickness direction); an anisotropic electroconductive sheet which exhibits electroconductivity only in the thickness direction only in a case in which stress is applied to the sheet in the thickness direction; and so forth.

Such an anisotropic electroconductive sheet enables compact electronic connection without involving soldering, mechanical fitting, and so forth. Furthermore, the anisotropic electroconductive sheet has the advantage of enabling flexible connection while absorbing mechanical shock and distortion. Anisotropic electroconductive sheets having such advantages are widely used in the fields of liquid crystal displays, cellular phones, electronic calculators, electronic digital clocks, electronic cameras, computers, and so forth.

Such an anisotropic electroconductive sheet is also referred to as "elastomer sheet". Examples of elastomer connectors employing such anisotropic electroconductive sheets include: the alternately-stacked type (which will also be referred to as "alternately-layered type") elastomer connector having a structure in which electroconductive elastomer sheets and insulating elastomer sheets are alternately stacked; and the enclosure type (which will also be referred to as "sheet-type") elastomer connector having a structure in which an electroconductive portion is enclosed within an insulating portion, thereby providing the property of exhibiting electroconductivity in the direction perpendicular to the plane of the sheet, while serving as an insulator in the direction along the plane of the sheet.

Such elastomer connectors are widely used as connectors for electrically connecting circuit devices such as a printed board, leadless chip carrier, liquid crystal panel, and so forth, with each other.

FIG. 4 is a perspective view which shows an arrangement in which an enclosure-type elastomer connector employing an anisotropic electroconductive sheet according to conventional techniques is applied to a semiconductor measuring device. In FIG. 4, reference numeral 6 denotes a surface-mounting IC. Reference numeral 7 denotes an anisotropic electroconductive sheet.

As shown in FIG. 4, the IC 6 includes multiple leads 6A extending from the four side faces thereof. On the other hand, multiple contact pins 61 connected to the semiconductor measuring device are disposed so as to face the leads 6A with the anisotropic electroconductive sheet 7 introduced therebetween. The semiconductor measuring device, to which the multiple contact pins 61 are connected, is not shown in the drawing.

In FIG. 4, the anisotropic electroconductive sheet 7 is formed of an insulating elastomer sheet 7A serving as a base. The elastomer sheet 7A has multiple dot-shaped elastomer regions formed so as to enable current to flow between the front face and the back face thereof. The dot-shaped elastomer regions 7B are arranged corresponding to the array of the multiple leads 6A.

As shown in FIG. 4, upon pressing the multiple leads 6A onto the surfaces of the dot-shaped elastomer regions 7B, the multiple measurement contact pins 61 are pressed into contact with the dot-shaped elastomer regions 7B from the back. This electrically connects the multiple contact pins 61 with the multiple leads 6A through the dot-shaped elastomer regions 7B, thereby enabling measurement of the IC 6.

With such an arrangement, measurement is made with the anisotropic electroconductive sheet introduced between the leads of the IC and the measurement contact pins. This enables measurement of the IC without damaging the leads of the IC.

On the other hand, FIG. 5 is a perspective view which shows a conventional arrangement in which an LCD (Liquid Crystal Display) and a control board are connected through an alternately-stacked anisotropic electroconductive sheet. In FIG. 5, reference numeral 8 denotes an LCD, reference numeral 9 denotes an anisotropic electroconductive sheet, and reference numeral 81 denotes a control board for controlling the LCD 8.

In FIG. 5, the anisotropic electroconductive sheet 9 has a layered structure in which thin film electroconductive elastomer sheets 9A and thin film insulating elastomer sheets 9B are alternately stacked. Furthermore, silicon rubber members 9C, which serve as adhesive, are provided to both side faces of the layered structure along the film stacking direction. The anisotropic electroconductive sheet 9 having such a layered structure is provided to both sides of the control board 81.

With such an arrangement, the LCD 8 is mounted on the anisotropic electroconductive sheet 9 using holding means, as shown in FIG. 5. This enables electrodes formed on the LCD 8 at a fine pitch and edge connectors (line connection terminals) formed on the control board 81 at a fine pitch to be connected through the anisotropic electroconductive sheet 9.

A manufacturing method for the anisotropic electroconductive sheet 9 shown in FIG. 5 is known as follows. That is to say, first, an insulating material is applied to metal wires arranged in parallel at a predetermined pitch so as to form a single anisotropic electroconductive block. Then, the anisotropic electroconductive block is thinly sliced in the direction perpendicular to the axes of the metal wires, thereby obtaining the anisotropic electroconductive sheets 9 (See Patent Document 1, for example).

[Patent Document 1] Japanese Unexamined Patent Application, First Publication No. 2000-340037

DISCLOSURE OF THE INVENTION

Problems to be Solved by the Invention

However, the anisotropic electroconductive sheet shown in FIG. 4 has a structure in which each electroconductive region is enclosed by an insulating region, leading to difficulty in reducing the pitch at which the electroconductive regions are arranged. This leads to a problem as follows. Let us consider a conventional arrangement in which an anisotropic electroconductive sheet of the type shown in FIG. 4 is applied to a semiconductor measurement device. With such a conventional arrangement, the semiconductor measurement device cannot make measurement in a case in which the contact pins are arrayed at a pitch corresponding to an IC having leads arrayed at a finer pitch. In order to solve the aforementioned problem, let us consider an arrangement employing cantilever contact members instead of the contact pins. While such an arrangement exhibits improved measurement pitch, measurement with this arrangement also requires that a certain amount of the stress be applied to the anisotropic electroconductive sheet, leading to the pitch being limited to 0.4 mm. Accordingly, there is a need for a technique for applying an anisotropic electroconductive sheet, which is to be connected to the contact pins of a semiconductor measurement device, to leads formed at a fine pitch on an electronic device (including a printed board) to be measured. Furthermore, such an anisotropic electroconductive sheet can preferably be applied to contact pins arrayed at a greater pitch.

On the other hand, the anisotropic electroconductive sheet shown in FIG. 5 can be formed with the electroconductive elastomer regions 9A arranged at a pitch of around 0.1 mm. However, this anisotropic electroconductive sheet has the disadvantage that the electrodes of an LCD and the electrodes of an electronic device or a printed board, which are provided with an offset in the direction along the plane of the face thereof, cannot be connected with each other through such an anisotropic electroconductive sheet.

On the other hand, the anisotropic electroconductive sheet disclosed in Patent Document 1 is useful for connecting an LCD and a control board provided near the LCD in the thickness direction. However, such an anisotropic electroconductive sheet has difficulty in connecting an LCD with an electronic device or a printed board provided with an offset in the direction along the plane of the face.

In order to connect such a pair of electronic device components which may include a printed board, and which are provided with an offset in the direction along the plane of the face, an FPC (Flexible Printed Circuit) or FFC (Flexible Flat Cable) is employed, for example. However, the FPC and the FFC are formed of a rigid material (e.g., polyimide), leading to a problem of not making the best use of the advantages of the anisotropic electroconductive sheet, i.e., the advantage of enabling flexible connection between connection terminals while absorbing mechanical shock and distortion therefrom.

It is an object of the present invention to provide a multilayer anisotropic-electroconductive sheet for connecting a pair of electronic device components provided with an offset so as to make the best use of the advantages of the anisotropic electroconductive sheet, i.e., the advantage of enabling flexible connection between connection terminals.

Means for Solving the Problems

In order to solve the aforementioned problems, the inventor has proposed a multilayer electroconductive sheet as an invention as follows.

In a first aspect of the present invention, an electric connection member includes an anisotropic electroconductive sheet which includes: an elastomer sheet; first elastomer regions formed on the elastomer sheet at a predetermined pitch; and second elastomer regions formed on the elastomer sheet at a predetermined pitch. With such an arrangement, each of the first elastomer regions and the second elastomer regions is formed of electroconductive elastomer so as to enable current to flow between the front and the back thereof. The anisotropic electroconductive sheet further includes wiring patterns which enable an electric connection between each of the first elastomer regions and a corresponding one of the second elastomer regions. The first elastomer regions are arranged at a different pitch from that at which the second elastomer regions are arranged.

In a second aspect of the present invention, an electric connection member described in the first aspect of the present invention has an elastomer sheet that has an insulating property, or a predetermined dielectric constant.

In a third aspect of the present invention, an electric connection member described in the first or second aspects of the present invention further includes a second anisotropic electroconductive sheet. With such an arrangement, the second anisotropic electroconductive sheet includes: an insulating second elastomer sheet; and multiple third elastomer regions, which are formed so as to be arranged on the second elastomer sheet at a predetermined pitch, and each of which is electroconductive so as to enable current to flow between the front and the back thereof. The anisotropic electroconductive sheet and the second anisotropic electroconductive sheet are layered one upon the other.

In a fourth aspect of the present invention, in an electric connection member described in a third aspect of the present invention, the third elastomer regions are arranged on the second anisotropic electroconductive sheet so as to match the first elastomer regions arranged on the anisotropic electroconductive sheet. With such an arrangement, the second anisotropic electroconductive sheet and the anisotropic electroconductive sheet are layered one upon the other such that the third elastomer regions and the first elastomer regions are in contact with each other.

In a fifth aspect of the present invention, an electric connection member described in the third or fourth aspects of the present invention has third elastomer regions, each of which is electroconductive so as to enable current to flow between the front and the back thereof, are provided in a dotted pattern on the insulating second elastomer sheet.

In a sixth aspect of the present invention, an electric connection member described in any one of the third through fifth aspects of the present invention has the third elastomer regions, each of which is electroconductive so as to enable current to flow between the front and the back thereof, are provided on the insulating second elastomer sheet in a predetermined pattern.

In a seventh aspect of the present invention, an electric connection member described in any one of the third through sixth aspects of the present invention has the second elastomer regions, each of which is electroconductive so as to enable current to flow between the front and the back thereof, are provided in a dotted pattern on the insulating elastomer sheet.

In an eighth aspect of the present invention, an electric connection member described in any one of the third through seventh aspects of the present invention has the second elastomer regions, each of which is electroconductive so as to enable current to flow between the front and the back thereof, are provided on the insulating elastomer sheet in a predetermined pattern.

In a ninth aspect of the present invention, a pair of electronic components is electrically connected through an electric connection member described in any one of the first through eighth aspects of the present invention.

An arrangement according to the present invention described in the first aspect of the present invention may include a multilayer anisotropic electroconductive sheet having a layered structure in which multiple anisotropic electroconductive sheets are layered. That is to say, such an arrangement according to the present invention described in the first aspect of the present invention may include a multilayer anisotropic electroconductive sheet having a layered structure in which at least two anisotropic electroconductive sheets are layered. With such an arrangement, each anisotropic electroconductive sheet has a structure in which elastomer regions, each of which is electroconductive so as to enable current to flow between the front and the back thereof, are formed on an insulating elastomer sheet. Furthermore, at least one of the anisotropic electroconductive sheets has a structure in which each of a group of elastomer regions is connected to a corresponding one of the elastomer regions forming another group through a wiring pattern. Upon pressing the layered structure in the thickness direction, the multiple wiring patterns are three-dimensionally connected through the elastomer regions.

With an arrangement according to the present invention described in the second aspect of the present invention, the elastomer sheet employed as a base of the anisotropic electroconductive sheet may be an insulating elastomer sheet or an elastomer sheet having a predetermined dielectric constant.

The term "elastomer sheet" as used herein may be a sheet formed of a material such as rubber or the like, having a suitable elasticity and flexibility, in the shape of a sheet with a predetermined thickness, having a certain volume with a predetermined front area, and with a predetermined back area. Note that the term "in the shape of a sheet with a predetermined thickness, with a predetermined front area, and with a predetermined back area" may describe features of an ordinary sheet. The elastomer sheet has a predetermined thickness, and a front area and a back area which are greater than the cross-section thereof, and which face one another across the thickness thereof. The term "flexibility" as used herein may mean that the sheet can be elastically bent.

The "elastomer region which is electroconductive so as to enable current to flow between the front and the back thereof" may be a region which has a predetermined volume with a predetermined front area and a predetermined back area, and which is embedded in the elastomer sheet with the front area and back area being exposed. Furthermore, each elastomer region exhibits flexibility in the thickness direction of the sheet. Furthermore, the "elastomer region which is electroconductive so as to enable current to flow between the front and the back thereof" is electroconductive such that current is able to flow in the thickness direction of the elastomer sheet. The front area and the back area of the "elastomer region which is electroconductive so as to enable current to flow between the front and the back thereof", which are exposed on the front face and the back face of the elastomer sheet, may be formed in the shape of a circle or rectangle. Also, the front area and the back area thereof may be formed on the front face and the back face of the elastomer sheet (or near the front face and the back face thereof) in any shape.

The term "insulating elastomer sheet" as used herein may mean an elastomer sheet having the insulating property. The term "insulating property" as used here may mean that the elastomer sheet is endowed with sufficiently low electroconductivity, or has sufficiently high electric resistance. Furthermore, the "insulating elastomer sheet" may mean that the insulating property of the elastomer sheet is sufficient in a predetermined insulating direction throughout the overall area thereof.

The term "insulating elastomer sheet" means a sheet formed of an ordinary elastomer material. Specifically, examples of elastomer materials include: natural rubber; polyisoprene rubber; butadiene copolymer rubber, conjugated diene rubber, and hydrogen-saturated rubber thereof; block copolymer rubber and hydrogen-saturated rubber thereof; chloroprene polymer; vinyl chloride vinyl acetate copolymer; urethane rubber; polyester rubber; epichlorohydrin rubber; ethylene propylene copolymer rubber; ethylene propylene dien copolymer; soft liquid epoxy rubber; silicone rubber; fluoro rubber; and so forth. Examples of butadiene copolymer rubber and conjugated diene rubber include: styrene-butadiene; butadiene-acrylonitrile; butadiene-isobutylene; and so forth. Examples of block copolymer rubber include: styrene-butadiene-diene block copolymer rubber; styrene-isoprene block copolymer; and so forth.

Of these materials, silicone rubber is preferably employed from the perspective of the excellent heat resistance, low-temperature resistance, chemical resistance, weather resistance, electric insulation, and safety thereof. In general, the elastomer material has no electroconductivity. Accordingly, in general, the insulating elastomer sheet formed of such an elastomer material exhibits high volume electric resistance (1 M$\Omega$·cm or more at 100 V, for example), i.e., is endowed with a sufficient insulating property.

The term "elastomer region which is electroconductive so as to enable current to flow between the front and the back thereof" as used here may mean that the elastomer region of a certain volume which is embedded in the elastomer sheet is electroconductive, i.e., that it is endowed with sufficiently high electroconductivity. Also, such an elastomer region, having such a structure, is endowed with sufficient electroconductivity throughout the entire region thereof.

In general, the electroconductive elastomer may be formed of a material in which an electroconductive material is mixed in an insulating elastomer material so as to achieve a low specific volume resistance (e.g., 1 $\Omega$·cm or less). Specifically, the aforementioned ordinary elastomer materials may be employed as the insulating elastomer material.

Of these elastomer materials, silicone rubber is preferably employed from the perspective of the excellent heat resistance, low-temperature resistance, chemical resistance, weather resistance, electric insulation, and safety thereof. An electroconductive material is mixed in such an elastomer material, thereby forming an electroconductive elastomer. Examples of such electroconductive materials include: pure metals; alloys; and non-metal powders (or flakes, chips, foils, or the like). Examples of pure metals include: gold; silver; copper; nickel; tungsten; platinum; and palladium. Examples of alloys include: stainless steel (SUS); phosphor bronze; beryllium copper; and so forth. Examples of non-metal electroconductive materials include carbon and so forth. The carbon material may include carbon nanotubes, fullerenes, and so forth.

The electroconductive elastomer regions may be formed on the insulating elastomer sheet by chemical bonding, thereby forming an anisotropic electroconductive sheet. A coupling agent may be applied to the interface therebetween for such chemical bonding. Such a coupling agent may be a bonding agent for bonding these materials, and may be an ordinary commercially-available adhesive. Specifically, examples of coupling agents may include: silane coupling agent; aluminate coupling agent; titanate coupling agent; and so forth. In particular, the titanate coupling agent is preferably employed.

The "elastomer sheet having a predetermined dielectric constant" may be formed by mixing a material having a predetermined relative dielectric constant in an ordinary elastomer material in the shape of a sheet so as to form an elastomer sheet. Note that the dielectric constant may be determined based on the signal transmission properties which are necessary for the anisotropic electroconductive sheet. In a case of employing an insulating base having a low dielectric constant, the elastomer sheet thus manufactured may have generally the same dielectric constant as that of Teflon (registered trademark) employed in a rigid printed board, for example.

Linear wiring patterns are formed on such an anisotropic electroconductive sheet. Furthermore, multiple first elastomer regions, each of which is electroconductive so as to enable current to flow between the front and the back thereof, are arranged around one end of the wiring patterns. On the other hand, multiple second elastomer regions, each of which is electroconductive so as to enable current to flow between the front and the back thereof, are arranged around the other end of the wiring patterns. Each of the first elastomer regions is connected to a corresponding one of the second elastomer regions through the wiring pattern. Such an anisotropic electroconductive sheet may be manufactured as follows. First, a copper foil is layered and disposed on both faces or on one face of the anisotropic elastomer sheet. Then, etching is performed, thereby forming wiring patterns on the anisotropic elastomer sheet. Furthermore, the wiring patterns may be subjected to plating with gold, silver, solder, or the like. Furthermore, solder resist may be applied to the anisotropic elastomer sheet in the same way as with a rigid printed board.

A multilayer anisotropic electroconductive sheet according to the present invention may have a layered structure in which at least two layers of such anisotropic electroconductive sheets are layered. Such multiple anisotropic electroconductive sheets may be layered and adhered to each other by laminate-pressing. Also, the multiple anisotropic electroconductive sheets may be layered and adhered to each other by vacuum laminate-pressing. The first elastomer regions, the second elastomer regions, and the wiring patterns, may be provided to at least one of the multiple anisotropic electroconductive sheets. Also, the first elastomer regions, the second elastomer regions, and the wiring patterns, may be provided to all the multiple anisotropic electroconductive sheets. The multilayer anisotropic electroconductive sheet, having such a layered structure in which multiple anisotropic electroconductive sheets are layered, enables electric connection between a pair of electronic components provided at positions distanced horizontally and orthogonally from the plane of the sheet.

With regard to the multilayer anisotropic electroconductive sheet, the "electroconductive elastomer region" has the same function as that of a via hole formed in a rigid printed board. Also, the "electroconductive elastomer region" having a structure in which both ends thereof are exposed on the front and rear faces of the multilayer anisotropic electroconductive sheet serves as a connection terminal for external connection.

Thus, the multilayer anisotropic electroconductive sheet according to the present invention enables flexible connection between a pair of electronic components through the front face and the back face thereof. Furthermore, such a multilayer anisotropic electroconductive sheet serves as an elastomer connector which enables three-dimensional connection of a pair of electronic components. Such a multilayer anisotropic electroconductive sheet allows conversion of multiple connection terminals between a pair of electronic components, e.g., conversion from fine-pitch connection terminals to greater-pitch connection terminals. Furthermore, such a multilayer anisotropic electroconductive sheet can be employed as a so-called cable for connecting a pair of electronic components spaced from one another in the direction along the plane of the sheet.

A preferable arrangement according to the present may have a layered structure in which an anisotropic electroconductive sheet (second anisotropic electroconductive sheet) having no wiring patterns is layered on another anisotropic electroconductive sheet having wiring patterns for connecting each pair of elastomer regions (first elastomer regions and second elastomer regions). That is to say, the multilayer anisotropic electroconductive sheet according to the present invention includes: a second anisotropic electroconductive sheet having a structure in which third elastomer regions, each of which is electroconductive so as to enable current to flow between the front and the back thereof, are formed on an insulating second elastomer sheet; and an anisotropic electroconductive sheet having a structure in which first elastomer regions and second elastomer regions, each of which is electroconductive so as to enable current to flow between the front and the back thereof, are formed on an insulating second elastomer sheet, with the first elastomer regions matching the third elastomer regions. Furthermore, the anisotropic electroconductive sheet includes wiring patterns for connecting the first elastomer regions and the second elastomer regions. With such an arrangement, the anisotropic electroconductive sheet and the second anisotropic electroconductive sheet are layered one upon the other such that the third elastomer regions are in contact with the first elastomer regions.

Furthermore, the multilayer anisotropic electroconductive sheet may include the second anisotropic electroconductive sheet having a structure in which the third elastomer regions, each of which is electroconductive so as to enable current to flow between the front and the back thereof, are provided in a dotted pattern on the insulating second elastomer sheet. Also, the multilayer anisotropic electroconductive sheet may include a second anisotropic electroconductive sheet having a structure in which the third elastomer regions, each of which is electroconductive so as to enable current to flow between the front and the back thereof, are provided on the insulating second elastomer sheet in a predetermined pattern.

Also, the multilayer anisotropic electroconductive sheet may include an anisotropic electroconductive sheet having a structure in which the second elastomer regions, each of which is electroconductive so as to enable current to flow between the front and the back thereof, are provided in a dotted pattern on the insulating elastomer sheet. Also, the multilayer anisotropic electroconductive sheet may include an anisotropic electroconductive sheet having a structure in which the second elastomer regions, each of which is electroconductive so as to enable current to flow between the front and the back thereof, are provided on the insulating elastomer sheet in a predetermined pattern.

The structure, in which electroconductive elastomer regions are provided in a dotted pattern on the insulating elastomer sheet, is not restricted to the structure in which electroconductive elastomer regions are provided in a dotted pattern on the insulating elastomer sheet without a predetermined pattern. That is to say, the electroconductive elastomer regions may be provided on the elastomer sheet without a predetermined pattern, or may be provided at suitable positions in a predetermined pattern.

As described above, the electroconductive elastomer regions according to the present invention serve as connection terminals for external connection. Furthermore, an arrangement may be made in which a printed board is mounted on the multilayer anisotropic electroconductive sheet through the electroconductive elastomer regions matching the land pattern layout of the printed board. With such an arrangement, the multilayer anisotropic electroconductive sheet serves as an additional circuit for the circuit of the printed board.

The term "the elastomer regions are arranged in a predetermined pattern" means that the elastomer regions are arranged at suitable positions. Specifically, the electroconductive elastomer regions, each of which is formed in the shape of a rectangle or circle, may be arranged in the form of a lattice. In this case, the elastomer regions may be arranged in the form of a rectangular lattice, or a diamond-shaped lattice. Also, the elastomer regions may be arranged in a line at the same pitch.

With an arrangement in which the elastomer regions are provided at a pitch matching the land pattern layout of a printed board as described above, the electroconductive elastomer regions may be arranged at a pitch of 1/10 inch, i.e., 2.54 mm.

On the other hand, with an arrangement in which the elastomer regions are provided at a pitch matching a fine pitch at which inner leads, outer leads, or pads on an IC chip are arranged, the electroconductive elastomer regions are preferably arranged at a pitch of approximately 70 μm or less.

Furthermore, the first elastomer regions and the second elastomer regions, connected with one another through wiring patterns, are provided on the same elastomer sheet at a predetermined distance therebetween. This does not mean that the number of the first elastomer regions is the same as that of the second elastomer regions. Also, the number of the first elastomer regions may be different from that of the second elastomer regions. On the other hand, the second elastomer regions may be provided near the third elastomer regions. Also, the second elastomer regions may be provided at positions spaced from those of the third elastomer regions.

As an application of the present invention, the multilayer anisotropic electroconductive sheet may be employed for connection between a pair of electronic components. The term "pair of electronic components" as used here means a pair of electronic components which are to be connected with each other through the multilayer anisotropic electroconductive sheet. Examples of the electronic components include: a printed board; and a fine-pitch electronic component (e.g., IC, LCD, and so forth). The pair of electronic components may comprise the same kind of electronic components. Also, the pair of electronic components may include different kinds of electronic components, such as a combination of a printed board and an IC, and so forth.

An electric connection member according to the present invention preferably includes a multilayer anisotropic electroconductive sheet. Such an electric connection member enables flexible connection between a pair of electronic components through the front and back faces of the anisotropic electroconductive sheet. That is to say, this enables a pair of electronic components to be three-dimensionally connected. Furthermore, this electric connection member enables conversion of multiple terminals between a pair of electronic components. For example, this electric connection member enables conversion from fine-pitch terminals to greater-pitch terminals. Furthermore, this electric connection member can be used as a so-called cable for connecting a pair of electronic components distanced from each other.

On the other hand, the electroconductive elastomer regions according to the present invention serve as connection terminals for external connection. Furthermore, an arrangement may be made in which a printed board is mounted on this multilayer anisotropic electroconductive sheet with the layout of the electroconductive elastomer regions matching the land pattern layout of the printed board. With such an arrangement, the multilayer anisotropic electroconductive sheet serves as an additional circuit for the circuit of the printed board.

PREFERRED MODE FOR CARRYING OUT THE INVENTION

Description will be made below regarding an optimal arrangement for carrying out the present invention with reference to the drawings.

Figure 1:
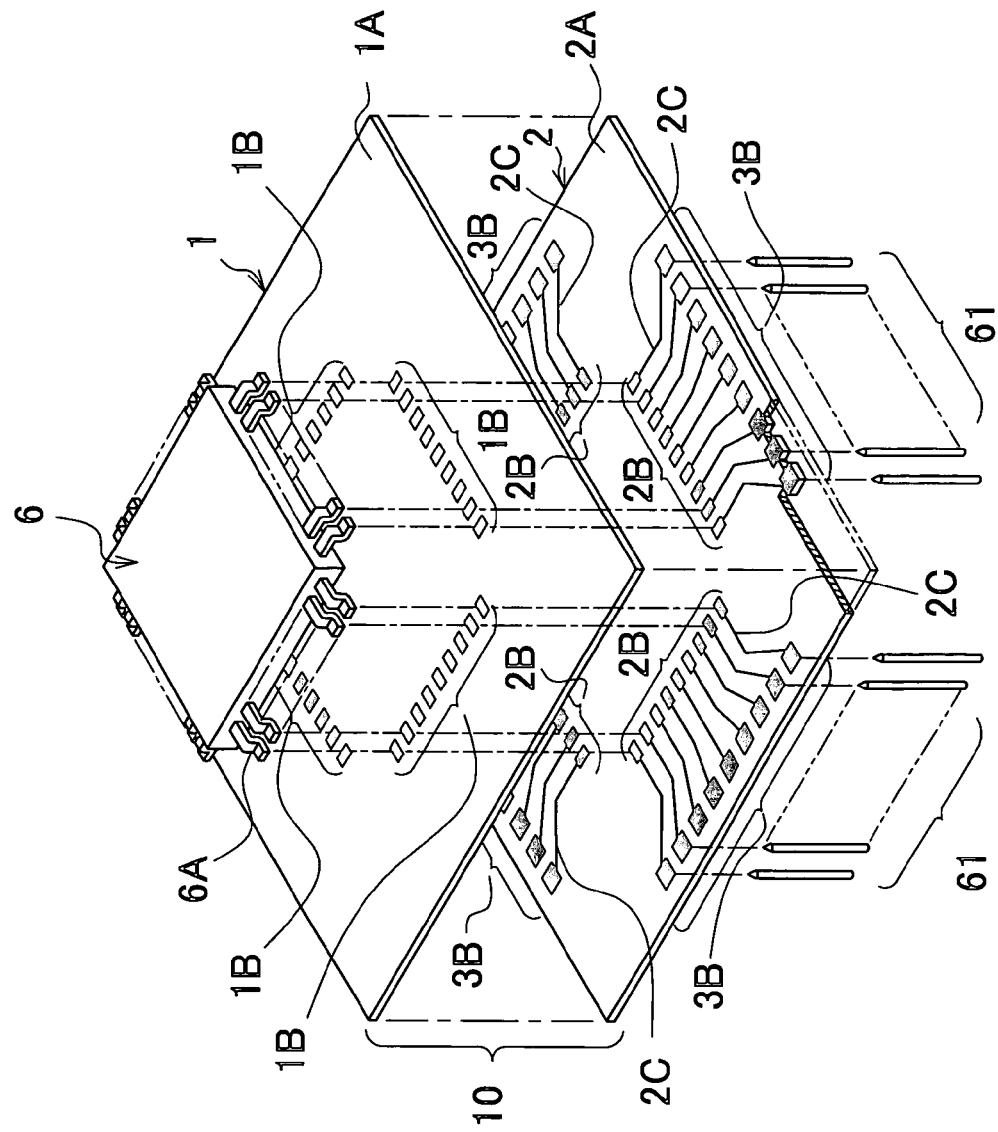
FIG. 1 is a disassembled perspective view which shows a structure of an electric connection member according to a first embodiment of the present invention.
Figure 4:
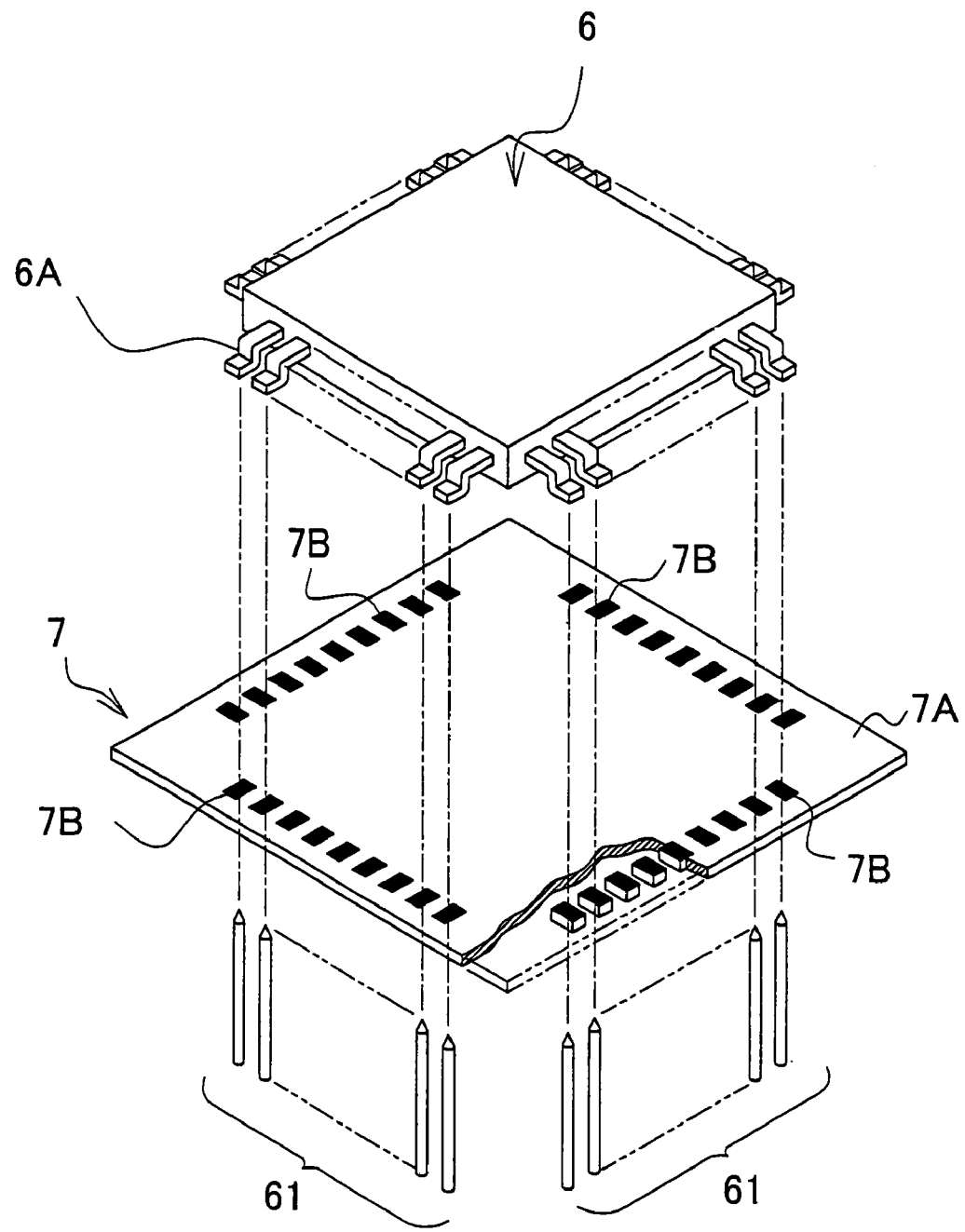
FIG. 4 is a perspective view which shows an arrangement in which an anisotropic electroconductive sheet according to conventional techniques is applied to a semiconductor measuring device.

FIG. 1 is a disassembled perspective view which shows a structure of an electric connection member 10 according to a first embodiment of the present invention. The electric connection member 10 is an elastomer connector for electrically connecting an IC 6 and a set of contact pins 61, which forms a pair of electronic device components. Measurement is made with the electric connection member 10 introduced between the IC 6 and the contact pins 61, as shown in FIG. 1. The electric connection member 10 includes a multilayer anisotropic electroconductive sheet having a layered structure in which multiple anisotropic electroconductive sheets are layered. In FIG. 1, reference numeral 1 denotes a second anisotropic electroconductive sheet, and reference numeral 2 denotes an anisotropic electroconductive sheet. Note that FIG. 4 shows a comparative example according to conventional techniques, for comparison with the first embodiment according to the present invention shown in FIG. 1. Accordingly, the same components shown in FIG. 1 as those shown in FIG. 4 are denoted by the same reference numerals, and description thereof will be omitted.

With the first embodiment shown in FIG. 1, the second anisotropic electroconductive sheet 1 includes a second elastomer sheet 1A, formed of an insulating elastomer sheet, as a base. Furthermore, the second elastomer sheet 1A has third elastomer regions 1B, which are formed of multiple dot-shaped electroconductive elastomer regions, each of which enables current to flow between the front face and the back face thereof.

The second anisotropic electroconductive sheet 1 is provided at a position adjacent to an IC 6 which is one of the devices to be connected. With such an arrangement, the third elastomer regions 1B are arranged corresponding to an array of multiple leads 6A of the IC 6. Each of the third elastomer regions 1B is formed of a material in which electroconductive particles are mixed in silicone rubber. The second anisotropic electroconductive sheet 1 has a structure in which the third elastomer regions 1B are arranged in a predetermined pattern around the center of the second elastomer sheet 1A, thereby forming an enclosure-type elastomer connector.

According to the first embodiment shown in FIG. 1, the anisotropic electroconductive sheet 2 includes an elastomer sheet 2A, which is formed of an insulating elastomer sheet, as a base. Furthermore, the elastomer sheet 2A includes first elastomer regions 2B and second elastomer regions 3B. Both the first elastomer regions 2B and second elastomer regions 3B have a structure in which multiple dot-shaped electroconductive elastomer regions are arranged, thereby enabling current to flow between the front and the back thereof through each of the elastomer regions.

The first elastomer regions 2B are arranged on the anisotropic electroconductive sheet 2 so as to match the third elastomer regions 1B arranged on the second anisotropic electroconductive sheet 1. Both the first elastomer regions 2B and the second elastomer regions 3B are provided on the anisotropic electroconductive sheet 2. The second elastomer regions 3B are arranged around the edges of the anisotropic electroconductive sheet 2 so as to surround the first elastomer regions 2B. Each of the first elastomer regions 2B and the second elastomer regions 3B, which exhibit electroconductivity, is formed of a material in which electroconductive particles are mixed in silicone rubber. The anisotropic electroconductive sheet 2 has a structure in which the first elastomer regions 2B and the second elastomer regions 3B are arranged in a predetermined pattern on the first elastomer sheet 2A, thereby forming an enclosure-type elastomer connector.

As shown in FIG. 1, the first elastomer regions 2B are arranged at a fine pitch. On the other hand, the second elastomer regions 3B are arranged at a greater pitch. Furthermore, multiple wiring patterns 2C are formed on the face of the elastomer sheet 2A such that a one-to-one connection is formed between each of the finer-pitch first elastomer regions 2B and a corresponding greater-pitch second elastomer region 3B.

Furthermore, the second anisotropic electroconductive sheet 1 is layered on and fixed to the anisotropic electroconductive sheet 2, thereby forming a multilayer anisotropic electroconductive sheet, i.e., the electric connection member 10. In FIG. 1, the IC 6 is mounted above the multilayer anisotropic electroconductive sheet, specifically: adjoining the second anisotropic electroconductive sheet 1. On the other hand, the multiple contact pins 61 are provided underneath the multilayer anisotropic electroconductive sheet, specifically: adjoining the anisotropic electroconductive sheet 2.

With such an arrangement shown in FIG. 1, before measurement, the leads 6A of the IC 6 are pressed into contact with the third elastomer regions 1B formed on the second anisotropic electroconductive sheet 1, in the direction orthogonal to the face of the multilayer anisotropic electroconductive sheet. On the other hand, the multiple contact pins 61 are pressed into contact with the backs of the second elastomer regions 3B formed on the anisotropic electroconductive sheet 2. This electrically connects each of the multiple contact pins 61 to a corresponding one of the multiple leads 6A through the second elastomer regions 3B, the wiring patterns 2C, and the first elastomer regions 2B, formed on the anisotropic electroconductive sheet 2, and the third elastomer regions 1B formed on the second anisotropic electroconductive sheet 1, thereby enabling measurement of the IC 6.

With the first embodiment shown in FIG. 1, measurement of an IC having leads arranged at a fine lead pitch can be made using contact pins arranged at a greater pitch through an electric connection member formed of a multilayer anisotropic electroconductive sheet. Such measurement cannot be made with conventional techniques.

Figure 2:
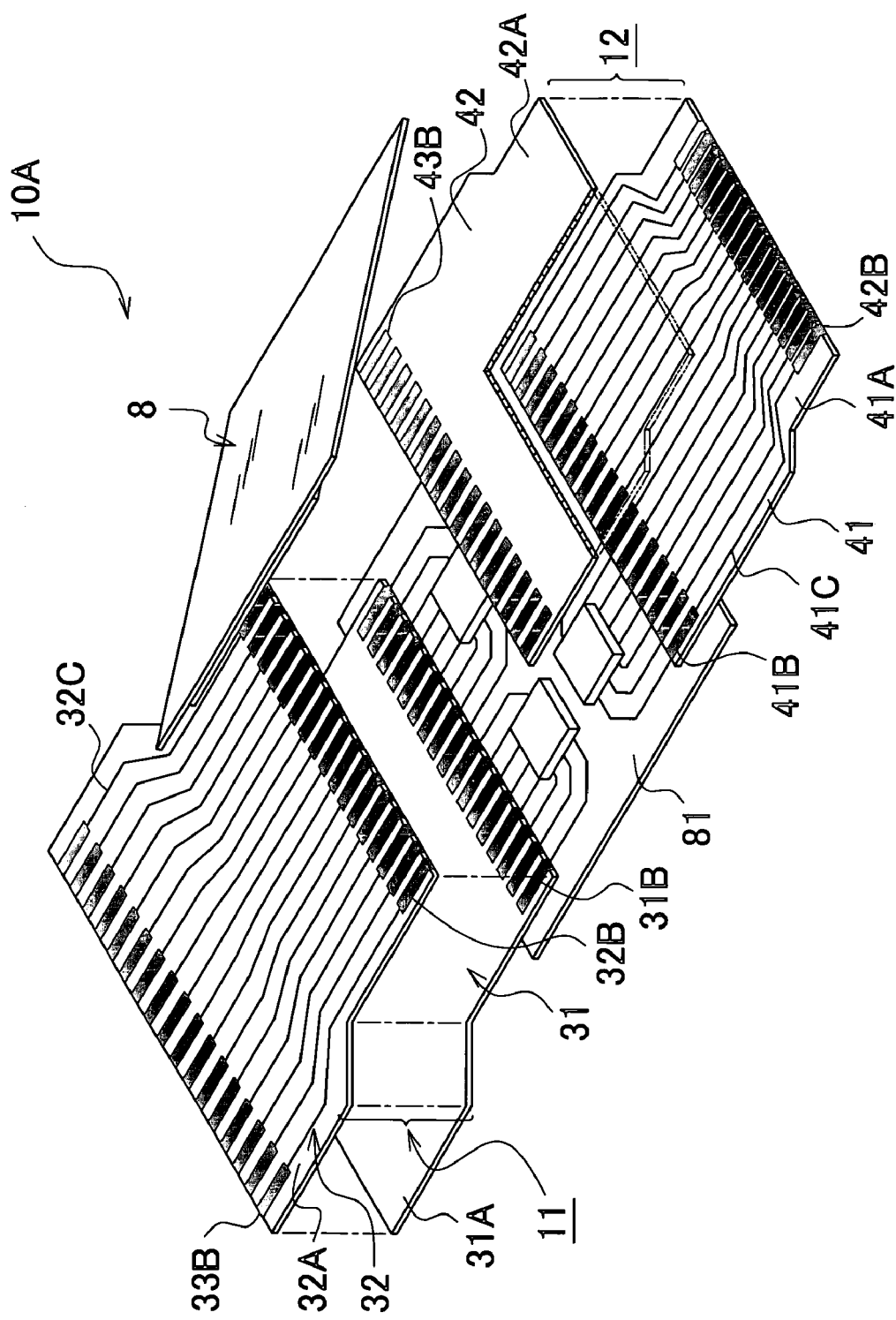
FIG. 2 is a disassembled perspective view which shows a structure of an electric connection member according to a second embodiment of the present invention.

FIG. 2 is a disassembled perspective view which shows a structure of an electric connection member 10A according to a second embodiment of the present invention. The electric connection member 10A is provided between the LCD 8 and the control board 81, and serves as an elastomer connector for electrically and vertically connecting a pair of electric components, i.e., the LCD 8 and the control board 81. Furthermore, the electric connection member 10A serves as a cable for electrically connecting the LCD 8 and/or the control board 81 to an electronic component (not shown) provided at a certain distance in the horizontal direction from the LCD 8 and from the control board 81.

Figure 5:
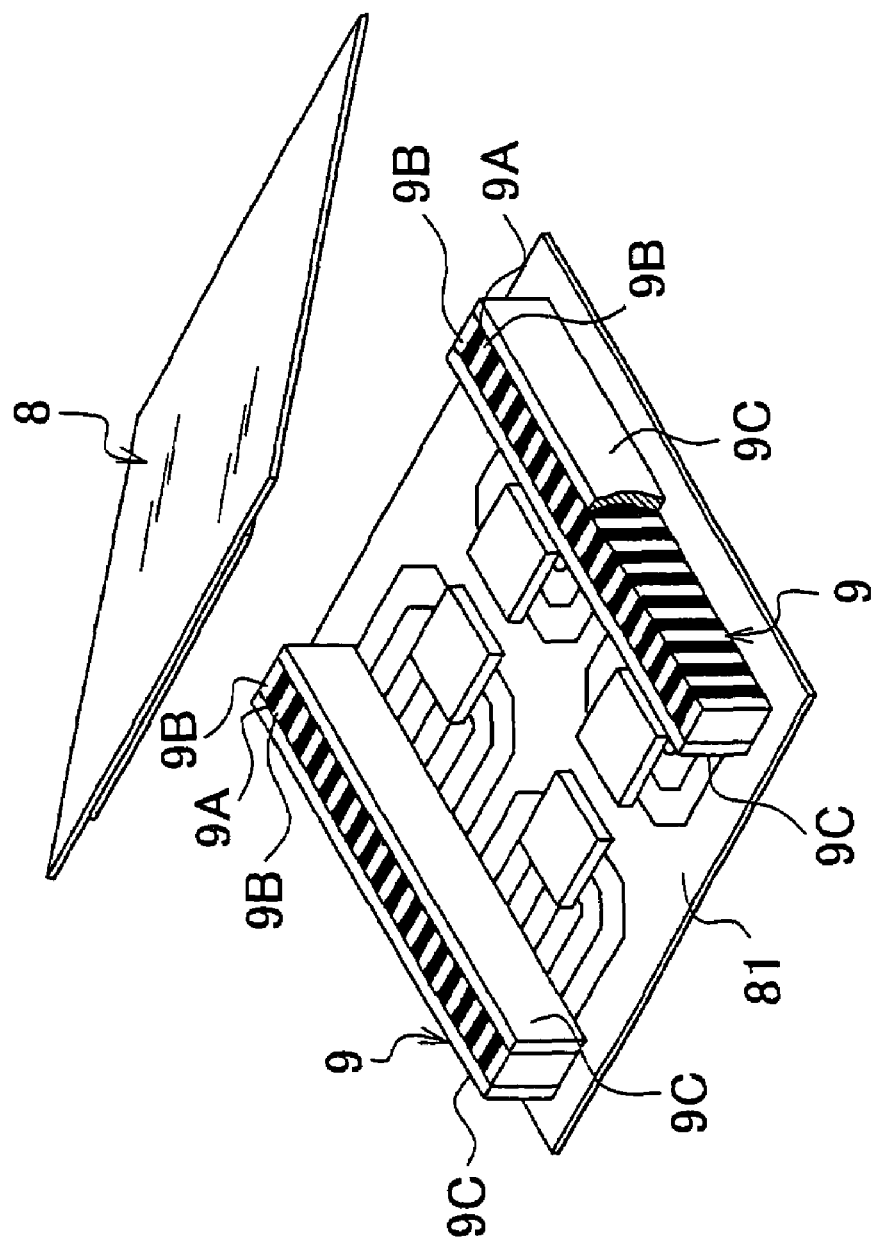
FIG. 5 is a perspective view which shows a conventional arrangement in which an LCD and a control board are connected with each other through an anisotropic electroconductive sheet.

The electric connection member 10A includes a pair of multilayer anisotropic electroconductive sheets, i.e., a first multilayer anisotropic electroconductive sheet 11 and a second multilayer anisotropic electroconductive sheet 12, each of which has a layered structure in which two anisotropic electroconductive sheets are layered one upon the other. As shown in FIG. 2, the first multilayer anisotropic electroconductive sheet 11 includes a second anisotropic electroconductive sheet denoted by reference numeral 31 and an anisotropic electroconductive sheet denoted by reference numeral 32. On the other hand, the second multilayer anisotropic electroconductive sheet 12 includes a third anisotropic electroconductive sheet denoted by reference numeral 41 and a fourth anisotropic electroconductive sheet denoted by reference numeral 42. Note that FIG. 5 shows a comparative example according to conventional techniques, for comparison with the second embodiment shown in FIG. 2. Accordingly, the same components shown in FIG. 2 as those shown in FIG. 5 are denoted by the same reference numerals, and description thereof will be omitted.

With the second embodiment shown in FIG. 2, the second anisotropic electroconductive sheet 31 includes a second elastomer sheet 31A, formed of insulating elastomer in the form of a sheet, as a base. The second anisotropic electroconductive sheet 31 is formed such that the width of one end is smaller than that of the opposite end. Furthermore, third elastomer regions 31B, each of which is formed of electroconductive elastomer in the shape of a rectangle, and each of which enables current to flow between the front and the back thereof, are provided in a predetermined pattern on the smaller-width end of the second elastomer sheet 31A employed as a base of the second anisotropic electroconductive sheet 31.

The third elastomer regions 31B are arranged corresponding to the array of the electrodes of the LCD 8. Each of the third elastomer regions 31B, which are electroconductive, is formed of a material in which electroconductive particles are mixed in silicone rubber. As described above, on one end of the second anisotropic electroconductive sheet 31, the electroconductive elastomer regions, each of which is formed in the shape of a rectangle, are arranged in a predetermined pattern on the second elastomer sheet 31A. Furthermore, the second anisotropic electroconductive sheet 31 and the anisotropic electroconductive sheet 32 are layered one upon the other, thereby forming an alternately-stacked type elastomer connector.

With the second embodiment shown in FIG. 2, the second anisotropic electroconductive sheet 32 includes a second elastomer sheet 32A, formed of insulating elastomer in the form of a sheet, as a base. The anisotropic electroconductive sheet 32 is formed in generally the same shape as that of the second anisotropic electroconductive sheet. Specifically, the anisotropic electroconductive sheet 32 is formed such that the width of one end is smaller than that of the opposite end. Furthermore, first elastomer regions 32B, each of which is formed of electroconductive elastomer in the shape of a rectangle, and each of which enables current to flow between the front and the back thereof, are provided in a predetermined pattern on the smaller-width end of the elastomer sheet 32A employed as a base of the anisotropic electroconductive sheet 32. On the other hand, second elastomer regions 33B, each of which is formed of electroconductive elastomer in the shape of a rectangle, and each of which enables current to flow between the front and the back thereof, are provided in a predetermined pattern on the larger-width end of the elastomer sheet 32A.

While the anisotropic electroconductive sheet 32 has elastomer regions arranged on both ends thereof, the second anisotropic electroconductive sheet 31 has the elastomer regions arranged on only one end thereof. With such an arrangement, the first elastomer regions 32B are arranged on the anisotropic electroconductive sheet 32 so as to match the third elastomer regions 31B arranged on the second anisotropic electroconductive sheet 31. The second elastomer regions 33B are provided on the larger-width end of the elastomer sheet 32A at a greater pitch than that at which the first elastomer regions 32B are provided on the smaller-width end. Each electroconductive elastomer region, formed in the shape of a rectangle, which is a component of the first elastomer regions 32B and the second elastomer regions 33B, is formed of a material in which electroconductive particles are mixed in silicone rubber.

With regard to the smaller-width end of the anisotropic electroconductive sheet 32, the first elastomer regions 32B are arranged in a predetermined pattern on the elastomer sheet 32A. On the other hand, the second elastomer regions 33B are arranged in a predetermined pattern on the larger-width end of the anisotropic electroconductive sheet 32. This forms alternately-stacked type elastomer connectors on both ends of the anisotropic electroconductive sheet 32.

As shown in FIG. 2, the first elastomer regions 32B are arranged at a fine pitch. On the other hand, the second elastomer regions 33B are arranged at a greater pitch. Multiple wiring patterns 32C are formed on the face of the elastomer sheet 32A in a predetermined pattern such that a one-to-one connection is formed between each of the finer-pitch rectangular first elastomer regions 32B and a corresponding one of the greater-pitch rectangular second elastomer regions 33B.

Then, the second anisotropic electroconductive sheet 31 and the anisotropic electroconductive sheet 32 are layered and adhered to each other such that each of the first elastomer regions 32B is in contact with a corresponding one of the third elastomer regions 31B, thereby forming the first multilayer anisotropic electroconductive sheet 11. Thus, the first multilayer anisotropic electroconductive sheet 11 serves as an elastomer connector for electrically connecting each pair of electronic components provided so as to face one another in the thickness direction of the first multilayer anisotropic electroconductive sheet 11 (in the direction in which the anisotropic electroconductive sheets have been layered). Furthermore, as shown in FIG. 2, the first multilayer anisotropic electroconductive sheet 11 serves as a sheet cable for electrically connecting each pair of electronic components provided thereon at a certain distance therebetween in the direction along the plane of the face of the first multilayer anisotropic electroconductive sheet 11.

That is to say, the first elastomer regions 32B and the third elastomer regions 31B are arranged at a fine pitch on one end of the first multilayer anisotropic electroconductive sheet 11. Such a structure enables connection in the thickness direction between electrodes formed at a fine pitch on the LCD 8 and edge connectors formed at the same fine pitch on the control board 81. On the other hand, while the first elastomer regions 32B are formed at the fine pitch, the second elastomer regions 33B are formed at a greater pitch, on the same face. Such a structure enables flexible connection between the LCD 8 or the control board 81 and an electronic component (not shown) provided at a certain distance therefrom.

On the other hand, according to the second embodiment shown in FIG. 2, the third anisotropic electroconductive sheet 41 includes a third elastomer sheet 41A, formed of insulating elastomer in the form of a sheet, as a base. The third anisotropic electroconductive sheet 41 is formed such that the width of one end is smaller than that of the opposite end. Furthermore, elastomer regions are provided to both the ends having different widths. Specifically, fourth elastomer regions 41B, each of which is formed of electroconductive elastomer in the shape of a rectangle, and each of which enables current to flow between the front and the back thereof, are provided in a predetermined pattern on the larger-width end of the third elastomer sheet 41A employed as a base of the third anisotropic electroconductive sheet 41. On the other hand, fifth elastomer regions 42B, each of which is formed of electroconductive elastomer in the shape of a rectangle, and each of which enables current to flow between the front and the back thereof, are provided in a predetermined pattern on the other end, i.e., the smaller-width end of the third elastomer sheet 41A employed as a base of the third anisotropic electroconductive sheet 41.

The fourth elastomer regions 41B are arranged corresponding to the electrode array of the LCD 8. The fifth elastomer regions 42B are arranged at a finer pitch than that at which the fourth elastomer regions 41B are arranged. Each of the fourth elastomer regions 41B and the fifth elastomer regions 42B, which are electroconductive, is formed of a material in which electroconductive particles are mixed in silicone rubber.

With regard to the larger-width end of the third anisotropic electroconductive sheet 41, the fourth elastomer regions 41B are arranged on the third elastomer sheet 41A in a predetermined pattern. On the other hand, with regard to the smaller-width end thereof, the fifth elastomer regions 42B are arranged in a predetermined pattern. Such a structure forms alternately-stacked type elastomer connectors provided on both ends of the third anisotropic electroconductive sheet 41.

On the other hand, according to the second embodiment shown in FIG. 2, the fourth anisotropic electroconductive sheet 42 includes a fourth elastomer sheet 41A, formed of insulating elastomer in the form of a sheet, as a base. The fourth anisotropic electroconductive sheet 42 is formed such that the width of one end is smaller than that of the opposite end. Furthermore, sixth elastomer regions 43B, each of which is formed of electroconductive elastomer in the shape of a rectangle, and each of which enables current to flow between the front and the back thereof, are provided in a predetermined pattern on the larger-width end of the fourth elastomer sheet 42A employed as a base of the fourth anisotropic electroconductive sheet 42.

The sixth elastomer regions 43B are arranged so as to match the fourth elastomer regions 41B. Each of the sixth elastomer regions 43B, which are electroconductive, is formed of a material in which electroconductive particles are mixed in silicone rubber. With regard to the larger-width end of the fourth anisotropic electroconductive sheet 42, the sixth elastomer regions 43B are arranged on the fourth elastomer sheet 42A in a predetermined pattern, thereby forming an alternately-stacked type elastomer connector.

As shown in FIG. 2, the fourth elastomer regions 41B are arranged on the second multilayer anisotropic electroconductive sheet 12 at a finer pitch than that at which the second elastomer regions 33B are arranged on the first multilayer anisotropic electroconductive sheet 11. Furthermore, the sixth elastomer regions 42B are arranged on the second multilayer anisotropic electroconductive sheet 12 at a finer pitch than that at which the fourth elastomer regions 41B are arranged. Multiple wiring patterns 41C are formed on the face of the third elastomer sheet 41A in a predetermined pattern such that a one-to-one connection is formed between each of the fine-pitch fourth elastomer regions 41B and a corresponding one of the even finer-pitch fifth elastomer regions 42B.

Then, the third anisotropic electroconductive sheet 41 and the fourth anisotropic electroconductive sheet 42 are layered and adhered to each other such that each of the fourth elastomer regions 41B is in contact with a corresponding one of the sixth elastomer regions 43B, thereby forming the second multilayer anisotropic electroconductive sheet 12. Thus, the second multilayer anisotropic electroconductive sheet 12 serves as an elastomer connector, and also serves as a sheet cable, in the same way as the first multilayer anisotropic electroconductive sheet 11.

That is to say, the fourth elastomer regions 41B and the sixth elastomer regions 43B are arranged at a fine pitch on one end of the multilayer anisotropic electroconductive sheet 12. Such a structure enables connection in the thickness direction between electrodes formed at a fine pitch on the LCD 8 and edge connectors formed at the same fine pitch on the control board 81. On the other hand, while the fourth elastomer regions 41B are formed at the fine pitch, the fifth elastomer regions 43B are formed at an even finer pitch, on the same face. Such a structure enables flexible connection between the LCD 8 or the control board 81 and an electronic component (not shown) provided at a certain distance therefrom.

Figure 3B:
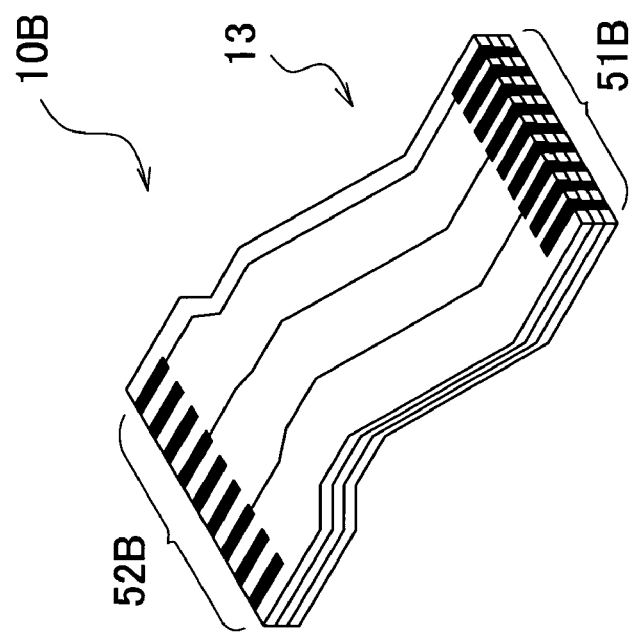
FIG. 3B is a perspective view which shows a structure of an electric connection member according to the third embodiment of the present invention.
Figure 3A:
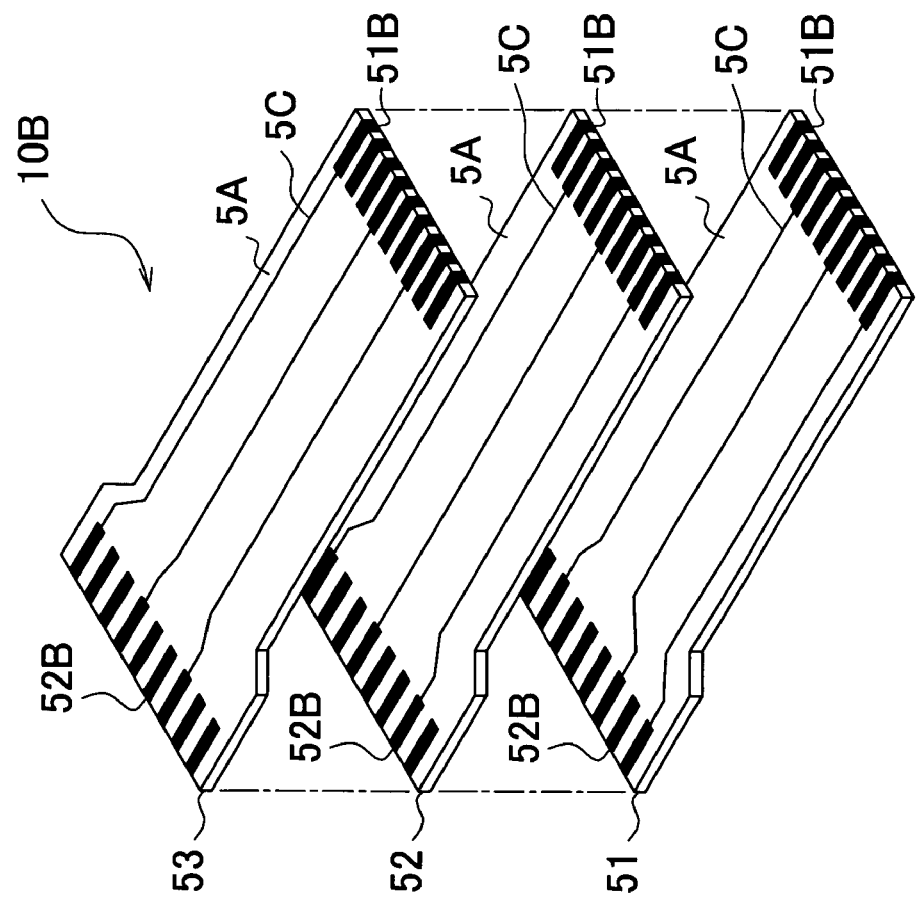
FIG. 3A is a perspective view which shows a structure of an electric connection member according to a third embodiment of the present invention.

Next, description will be made regarding an electric connection member 10B according to a third embodiment of the present invention with reference to FIGS. 3A and 3B. FIG. 3A is a disassembled perspective view which shows a structure of an electric connection member 10B according to the third embodiment of the present invention. FIG. 3B is an exterior perspective view of the electric connection member 10B shown in FIG. 3A.

The electric connection member 10B according to the third embodiment includes a multilayer anisotropic electroconductive sheet 13 having a layer structure in which three anisotropic electroconductive sheets 51 through 53 are layered. Each of the anisotropic electroconductive sheets 51 through 53 employs an elastomer sheet SA, which is formed in the shape of a sheet having a predetermined dielectric constant, as a base. Each of the anisotropic electroconductive sheets 51 through 53 is formed such that the width of one end is smaller than that of the opposite end. Furthermore, multiple first elastomer regions 51B, each of which is formed of electroconductive elastomer in the shape of a rectangle, and each of which enables current to flow between the front and the back thereof, are arranged in a predetermined pattern on the smaller-width end of the elastomer sheet 5A employed as a base of each of the anisotropic electroconductive sheets 51 through 53. On the other hand, multiple second elastomer regions 52B, each of which is formed of electroconductive elastomer in the shape of a rectangle, and each of which enables current to flow between the front and the back thereof, are arranged in a predetermined pattern on the other end, i.e., the larger-width end thereof.

Each of the first elastomer regions 51B and the second elastomer regions 52B, which are electroconductive, is formed of a material in which electroconductive particles are mixed in silicone rubber. Each of the anisotropic electroconductive sheets 51 through 53 has elastomer regions arranged on both ends thereof. Specifically, the first elastomer regions 51B are arranged on one end of each elastomer sheet 51A in a predetermined pattern. The second elastomer regions 52B are arranged on the other end thereof in a predetermined pattern. Such a structure forms alternately-stacked type elastomer connectors. Also, each of these elastomer connector serves as an edge connector.

As shown in FIGS. 3A and 3B, the first elastomer regions 51B are arranged at a finer pitch. On the other hand, the second elastomer regions 52B are arranged at a greater pitch. Multiple wiring patterns 5C are formed on the face of the elastomer sheet 5A in a predetermined pattern such that a one-to-one connection is formed between each of the finer-pitch first elastomer regions 51B and a corresponding one of the greater-pitch second elastomer regions 52B.

As shown in FIG. 3A, these three anisotropic electroconductive sheets are layered and adhered to each other, with the anisotropic electroconductive sheet 51 as a bottom sheet, with the anisotropic electroconductive sheet 52 as an intermediate sheet, and with anisotropic electroconductive sheet 53 as a top sheet. Such a layered structure forms a multilayer anisotropic electroconductive sheet 13.

In FIGS. 3A and 3B, the first elastomer regions 51B provided to each layer are pressed in the thickness direction, thereby effecting a connection between these layers. In the same way, the second elastomer regions 52B provided to each layer are pressed in the thickness direction, thereby effecting a connection between these layers. Furthermore, the wiring patterns 5C are provided to each layer such that they neither overlay nor overlap the other wiring patterns 5C on the adjacent layers. Such a structure forms a connector having a structure in which the wiring patterns are provided three-dimensionally.

The electric connection member 10B according to the present embodiment shown in FIGS. 3A and 3B is suitably employed as a high-speed transmission path between printed boards, for example.

With the electric connection member 10B shown in FIG. 3B, the one end thereof where the first elastomer regions 51B have been provided is pressed into contact with connection pins connected to a daughter board. On the other hand, the other end thereof where the second elastomer regions 52B have been provided is pressed into contact with connection pins connected to a mother board. The electric connection member 10B may have an internal structure in which high-speed transmission paths are three-dimensionally formed. The electric connection member 10B enables detachable and flexible connection between the daughter board and the mother board.

The invention claimed is:

1. An electric connection member for providing an electric continuity between a pair of objects, comprising:

a first anisotropically conductive sheet and a second anisotropically conductive sheet,
wherein the first anisotropically conductive sheet includes:
a first electrically insulating elastomer sheet;
first elastomer regions formed on said first electrically insulating elastomer sheet at a predetermined pitch;
second elastomer regions formed at a predetermined pitch on said first electrically insulating elastomer sheet,
wherein each of said first elastomer regions and said second elastomer regions is formed of electrically conductive elastomer, and said first elastomer regions are arranged at a pitch different from a pitch at which said second elastomer regions are arranged, and
wiring patterns which enable electric connection between said first elastomer regions and said second elastomer regions,
wherein the second anisotropically conductive sheet includes:
a second electrically insulating elastomer sheet; and third elastomer regions that are arranged at a predetermined pitch on said second electrically insulating elastomer sheet and electrically conductive,
wherein said first anisotropically conductive sheet and said second anisotropically conductive sheet are bonded together, and
wherein the first elastomer regions and the third elastomer regions are arranged at a common pitch, and the third elastomer regions are securely in contact with the first elastomer regions by bonding so as to reinforce electric continuity.

2. The electric connection member according to claim 1, wherein said first and second electrically insulating elastomer sheets have one of an insulating property and a predetermined dielectric constant.

3. The electric connection member according to claim 1, wherein said third elastomer regions are provided in a dotted pattern on said second electrically insulating elastomer sheet.

4. The electric connection member according to claim 1, wherein said third elastomer regions are provided in a predetermined pattern on said second electrically insulating elastomer sheet.

5. The electric connection member according to claim 1, wherein said second elastomer regions are provided in a dotted pattern on said first electrically insulating elastomer sheet.

6. The electric connection member according to claim 1, wherein said second elastomer regions are provided in a predetermined pattern on said first electrically insulating elastomer sheet.

7. The electric connection member according to claim 1, wherein the pair of objects is a pair of electronic components.

* * * * *